(12) United States Patent
Machinaga et al.

(10) Patent No.: US 11,476,375 B2
(45) Date of Patent: Oct. 18, 2022

(54) LIGHT DETECTION DEVICE

(71) Applicant: SUMITOMO ELECTRIC INDUSTRIES, LTD., Osaka (JP)

(72) Inventors: Kenichi Machinaga, Osaka (JP); Takeshi Okada, Osaka (JP); Akira Ouchi, Osaka (JP); Rie Maruyama, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 17/205,089

(22) Filed: Mar. 18, 2021

(65) Prior Publication Data

US 2021/0305443 A1   Sep. 30, 2021

(30) Foreign Application Priority Data

Mar. 31, 2020   (JP) .............................. JP2020-062024

(51) Int. Cl.
*H01L 31/0352* (2006.01)
*H01L 31/0224* (2006.01)
*H01L 31/101* (2006.01)
*H01L 31/02* (2006.01)

(52) U.S. Cl.
CPC ........... *H01L 31/035281* (2013.01); *H01L 31/02016* (2013.01); *H01L 31/022408* (2013.01); *H01L 31/101* (2013.01)

(58) Field of Classification Search
CPC ....... H01L 31/035281; H01L 31/02016; H01L 31/022408; H01L 31/101; H01L 31/035; H01L 31/02005; H01L 27/1443
See application file for complete search history.

(56) References Cited

U.S. PATENT DOCUMENTS

| 10,361,333 | B1* | 7/2019 | Rajavel | H01L 31/1013 |
| 2017/0250209 | A1* | 8/2017 | Piccione | H01L 31/107 |
| 2018/0294309 | A1* | 10/2018 | Wei | H01L 31/035236 |
| 2020/0292391 | A1* | 9/2020 | Suzuki | G01J 5/0225 |

FOREIGN PATENT DOCUMENTS

| JP | H07-249791 | 9/1995 |
| JP | H11-261084 | 9/1999 |

OTHER PUBLICATIONS

Biktashov et. al. "Indium Bumps Investigation for the Flip-chip Assembly" 7th International Siberian Workshop and Tutorial EDM'2006, Session I, Jul. 1-5, ERLAGOL (Year: 2006).*
Dautremont-Smith et. al. "Fabrication technologies for III-V . . . " AT&T Technical Journal (vol. 68, Issue: 1, pp. 64-82) Jan. 1, 1989 (Year: 1989).*

* cited by examiner

*Primary Examiner* — Sitaramarao S Yechuri
(74) *Attorney, Agent, or Firm* — IPUSA, PLLC

(57) ABSTRACT

A light detection device includes a photo detector and a circuit board connected to the photo detector by conductive connection parts. In this light detection device, the photo detector includes a substrate, a semiconductor layer provided on one surface of the substrate, a first groove dividing the semiconductor layer into sections for respective pixels, and first electrodes provided on the semiconductor layer and serving as the pixels. Each of the conductive connection part contains indium. Each of the first electrode includes a Ti layer and a Pt layer stacked in this order on the semiconductor layer, and the conductive connection parts are provided on the Pt layers of the first electrodes.

12 Claims, 17 Drawing Sheets

LIGHT DETECTION DEVICE

FIELD OF THE INVENTION

The present disclosure relates to a light detection device.

This application is based on and claims priority to Japanese Patent Application No. 2020-062024 filed on Mar. 31, 2020, and the entire contents of the Japanese patent application are incorporated herein by reference.

BACKGROUND ART

A light detection device for near-infrared light in which a photo detector for absorbing near-infrared light and having an n-electrode and a p-electrode formed on a semiconductor substrate and a signal processing board are connected by indium bumps (In-bumps) is disclosed as an example of light detection devices for near-infrared light.

RELATED ART DOCUMENTS

Patent Document

[Patent Document 1] Japanese Unexamined Patent Application Publication No. H07-249791

[Patent Document 2] Japanese Unexamined Patent Application Publication No. H11-261084

SUMMARY OF THE INVENTION

According to one aspect of a present embodiment, a light detection device includes a photo detector and a circuit board connected to the photo detector by conductive connection parts. In this light detection device, the photo detector includes a substrate, a semiconductor layer provided on one surface of the substrate, a first groove dividing the semiconductor layer into sections for respective pixels, and first electrodes provided on the semiconductor layer and serving as the pixels. Each of the conductive connection parts contains indium (In). Each of the first electrodes includes a Ti layer and a Pt layer stacked in this order on the semiconductor layer, and the conductive connection parts are provided on the Pt layers of the first electrodes.

DESCRIPTION OF EMBODIMENTS

Figure 1:
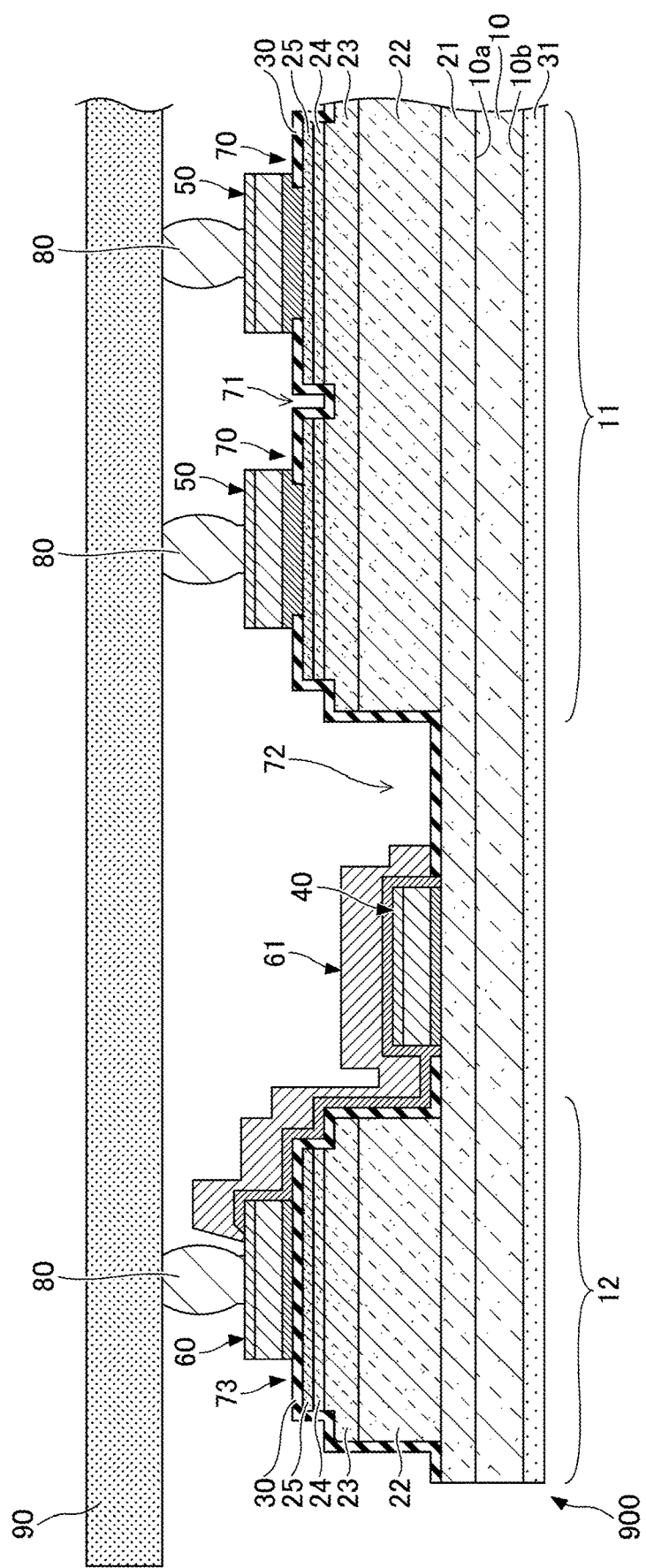
FIG. 1 is a cross-sectional view of a light detection device.

Conventionally, a light detection device for near-infrared light has been used at a low temperature, but in recent years, it has been investigated to mount a light detection device on a vehicle or the like. However, since indium included in an In-bump has a low melting point, indium may diffuse, and connection failure may occur between a photo detector and a signal processing board when the temperature in an operating environment is high.

For this reason, there is a demand for a highly reliable light detection device in which connection failure does not occur between a photo detector and a signal processing board even in a high-temperature use environment.

Embodiments according to the present disclosure will be described below.

Description of Embodiments of the Present Disclosure

First, the contents of embodiments according to the present disclosure will be listed and described. In the description, the same or corresponding elements are denoted by the same reference numerals and redundant descriptions thereof will be omitted.

[1] A light detection device according to one aspect of the present disclosure includes a photo detector and a circuit board connected to the photo detector by conductive connection parts. In this light detection device, the photo detector includes a substrate, a semiconductor layer provided on one surface of the substrate, a first groove for dividing the semiconductor layer into sections for respective pixels, and first electrodes provided on the semiconductor layer and serving as the pixels. Each of the conductive connection parts contains indium. Each of the first electrodes includes a Ti layer and a Pt layer stacked in this order on the semiconductor layer, and the conductive connection parts are provided on the Pt layers of the first electrodes.

As a result, it is possible to suppress the diffusion of indium contained in the conductive connection parts where the photo detector and the circuit board are connected, and thereby the reliability of the light detection device can be improved.

[2] Each of the conductive connection parts may include a connection core layer having a Ti layer and an Au layer stacked in this order on the Pt layer of the first electrode, and an indium layer (In-layer) covering the connection core layer.

As a result, the diffusion of indium contained in the In-layer can be suppressed, and furthermore, the adhesion between the Au layer and the In-layer can be enhanced by alloying Au and In, and the position of the molten indium can be stabilized.

[3] The thickness of the Ti layer in each of the first electrodes may be 50 nm or more and 100 nm or less, and the thickness of the Pt layer in each of the first electrodes may be 50 nm or more and 100 nm or less.

As a result, the reliability of the light detection device can be further enhanced.

[4] The semiconductor layer may include a first contact layer, a light receiving layer, a first wide gap layer, a second wide gap layer, and a second contact layer that are stacked in this order on the one surface of the substrate. The first groove may be a groove where the second contact layer, the second wide gap layer, and a part of the first wide gap layer are removed.

As a result, dark current in the photo detector can be reduced, and S/N ratio can be improved.

[5] The light detection device may further include, around the pixels, a second groove formed by removing the second contact layer, the second wide gap layer, the first wide gap layer, and the light receiving layer; a second electrode provided on the first contact layer exposed in the bottom surface of the second groove, a wiring electrode provided on a mesa of the semiconductor layer around the second groove, and a wiring connecting the second electrode and the wiring electrode. The wiring electrode may include a Ti layer and a Pt layer stacked in this order, and another conductive connection part may be also provided on the Pt layer of the wiring electrode, said another conductive connection part containing indium.

As a result, it is possible to suppress the diffusion of indium contained in the conductive connection parts where the photo detector and the circuit board are connected, and thereby the reliability of the light detection device can be improved.

[6] The wiring may include a Ti layer and an Au layer stacked in this order.

Even when Au is used for the wiring, indium on the wiring electrode does not diffuse, so that the reliability of the light detection device can be prevented from deteriorating.

[7] The light receiving layer may include InGaAs.

As a result, a highly reliable light detection device for near-infrared light can be obtained.

Details of Embodiments of the Present Disclosure

Hereinafter, an embodiment of the present disclosure will be described in detail, but the present embodiment is not limited thereto.

First, a light detection device in which a photo detector 900 and a signal processing board 90 are connected to each other by In-bumps 80 will be described with reference to FIG. 1.

The photo detector 900 of the light detection device shown in FIG. 1 includes an n-type contact layer 21, a light receiving layer 22, an n-type wide gap layer 23, a p-type wide gap layer 24, and a p-type contact layer 25 that are stacked in this order on one surface 10a of a substrate 10. On the other surface 10b of the substrate 10, an antireflection film 31 is formed of SiN or the like.

The substrate 10 is a semi-insulating substrate doped with Fe as an impurity element, and has a thickness of about 350 µm. The n-type contact layer 21 is formed of an n-InP layer having a thickness of about 2 µm, and is doped with Si having a concentration of about $2 \times 10^{18}$ cm$^{-3}$ as an n-type impurity element. The light receiving layer 22 is formed of an undoped $In_{0.53}Ga_{0.47}As$ layer having a thickness of about 3.5 µm, and has a bandgap of 0.75 eV at room temperature. Since the light receiving layer 22 is not intentionally doped with impurity elements, the impurity concentration of the light receiving layer 22 is $1 \times 10^{15}$ cm$^{-3}$ or less.

The n-type wide gap layer 23 is formed of an n-InP layer having a thickness of about 0.5 µm, and is doped with Si having a concentration of about $2 \times 10^{15}$ cm$^{-3}$ as an n-type impurity element. The p-type wide gap layer 24 is formed of a p-InP layer having a thickness of about 0.2 µm, and is doped with Zn having a concentration of about $2 \times 10^{15}$ cm$^{-3}$ as a p-type impurity element. Thus, a p-n junction is formed at the interface between the n-type wide gap layer 23 and the p-type wide gap layer 24. The p-type contact layer 25 is formed of a p-InGaAs layer having a thickness of about 0.1 µm, and is doped with Zn having a concentration of about $1 \times 10^{19}$ cm$^{-3}$ as a p-type impurity element.

A first groove 71 for pixel isolation and a second groove 72 for exposing the n-type contact layer 21 are formed in the photo detector 900 of the light detection device shown in FIG. 1. The first groove 71 is formed by removing the p-type contact layer 25, the p-type wide gap layer 24, and a part of the n-type wide gap layer 23. The n-type wide gap layer 23 is exposed in the bottom surface of the first groove 71. By forming the first groove 71 in this way, a mesa 70 is formed for each pixel to isolate each pixel. Here, p-electrodes 50 are formed on the p-type contact layer 25.

The second groove 72 is formed by further removing the n-type wide gap layer 23 and the light receiving layer 22. In the bottom surface of the second groove 72, the re-type contact layer 21 is exposed. An n-electrode 40 is formed on the exposed n-type contact layer 21.

A passivation film 30 is formed on the exposed top surfaces of the p-type contact layer 25, the n-type wide gap layer 23, and the n-type contact layer 21, and on the exposed side surfaces of the p-type contact layer 25, the p-type wide gap layer 24, the n-type wide gap layer 23, and the light receiving layer 22. The passivation film 30 is formed of SiN.

The photo detector 900 is divided into a pixel region 11 and an electrode connection region 12 by the second groove 72. In the electrode connection region 12, a wiring electrode 60 is formed on the p-type contact layer 25 through the passivation film 30. The wiring electrode 60 in the electrode connection region 12 and the n-electrode 40 on the n-type contact layer 21 are connected by a wiring 61. The wiring 61 is formed on a part of the wiring electrode 60, the n-electrode 40, and the passivation film 30 covering the side of the mesa 73 between the n-electrode 40 and the wiring electrode 60 in the electrode connection region 12.

In the light detection device shown in FIG. 1, the p-electrodes 50 and the wiring electrode 60 provided on the photo detector 900 are connected to electrodes (not shown) provided on the signal processing board 90 by the In-bumps 80. Since the In-bumps 80 are formed of indium and have an electric conductivity, the photo detector 900 and the signal processing board 90 are electrically connected by the In-bumps 80.

Figure 2:
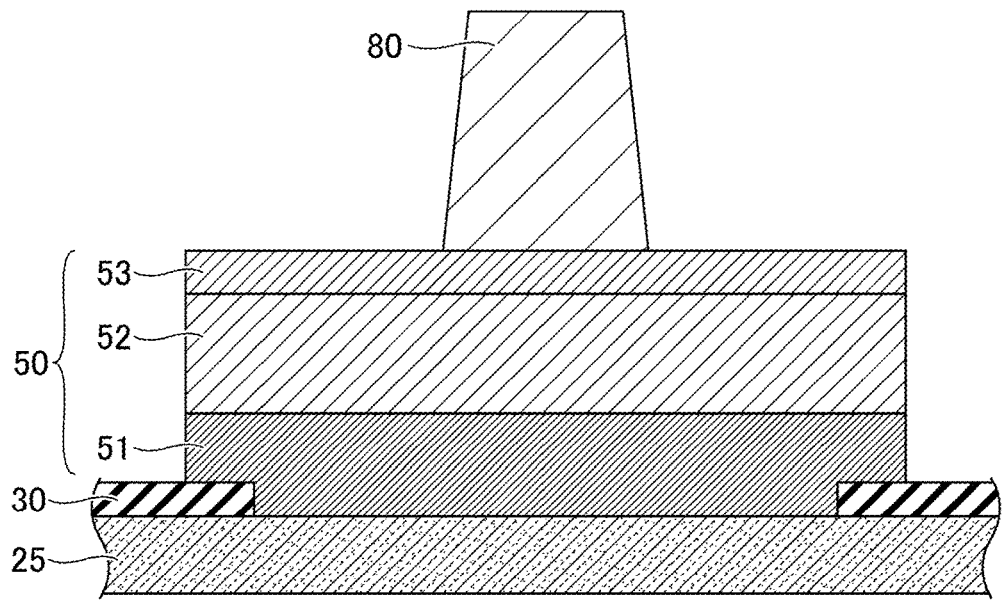
FIG. 2 is an explanatory view (1) of an electrode used in the light detection device shown in FIG. 1.
Figure 3:
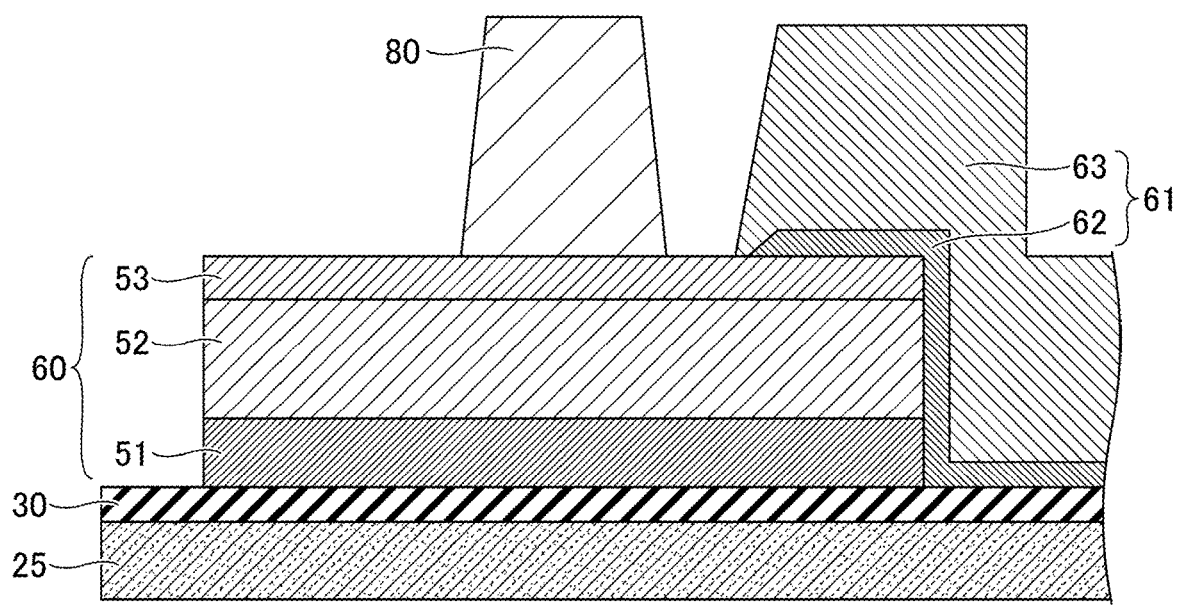
FIG. 3 is an explanatory view (2) of the electrode used in the light detection device shown in FIG. 1.

FIG. 2 is an enlarged view of a p-electrode 50 and an In-bump 80 in the pixel region 11 of the photo detector 900 prior to being connected to the signal processing board 90. FIG. 3 is an enlarged view of the wiring electrode 60 and the In-bump 80 in the electrode connection region 12 of the photo detector 900 prior to being connected to the signal processing board 90.

Each of the p-electrodes 50 and the wiring electrode 60 is formed of a metal laminated film in which a Ti (titanium) layer 51, a Ni (nickel) layer 52, and an Au (gold) layer 53 are stacked in this order. Although not shown, similarly to the p-electrodes 50 and the wiring electrode 60, the n-electrode 40 is formed of a metal laminated film in which a Ti layer 51, Ni layer 52, and an Au layer 53 are stacked in this order. The thickness of the Ti layer 51 layer is 50 nm, the thickness of the Ni layer 52 is 100 nm, and the thickness of the Au layer 53 layer is 30 nm. The wiring 61 is formed of a metal laminated film in which a Ti layer 62 and an Au layer 63 are stacked in this order.

When the signal processing board 90 and the photo detector 900 are connected by the In-bumps 80, a part of indium contained in the In-bumps 80 enters and diffuses into the Au layers 53 in the p-electrodes 50 and the wiring electrode 60, and is partially alloyed with Au. Thus, since a part of indium contained in the In-bumps 80 diffuses into the Au layers 53 and is alloyed with Au, the adhesion between the In-bumps 80 and the Au layers 53 can be improved.

Figure 4:
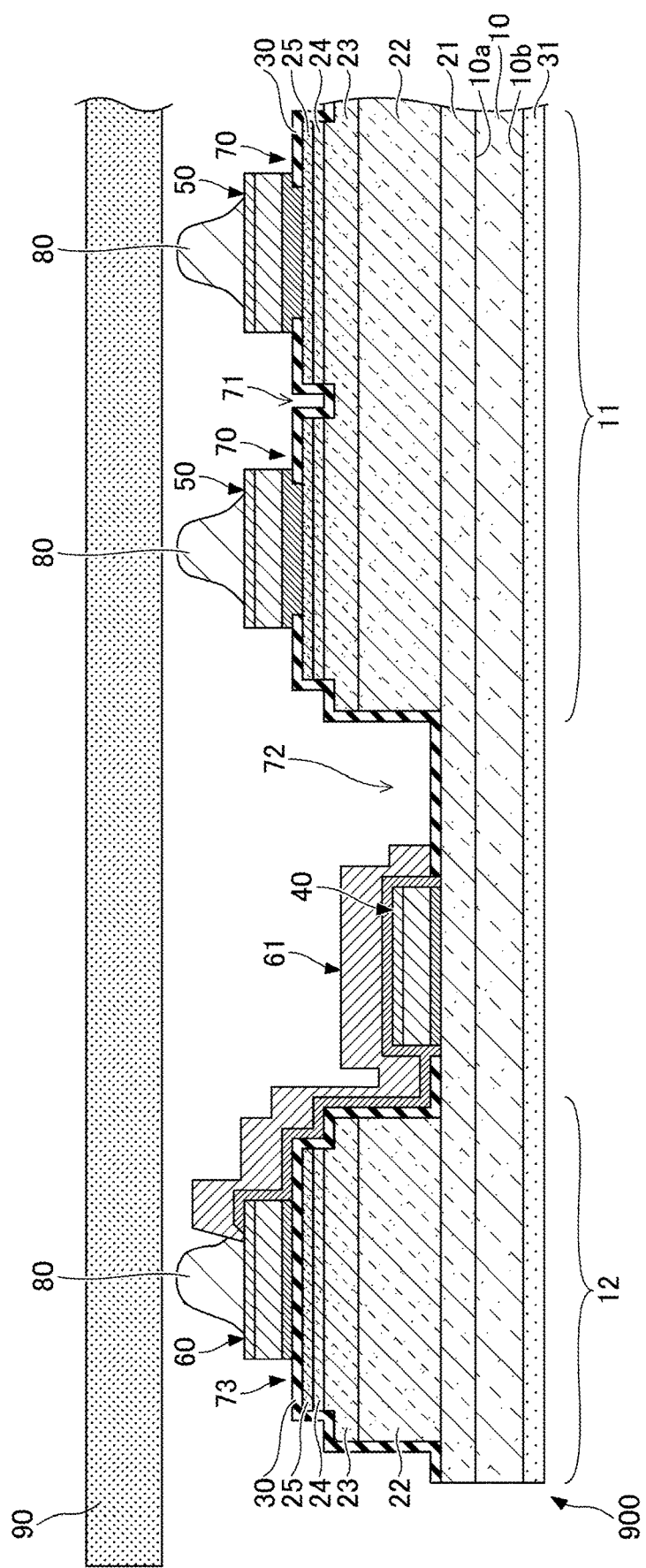
FIG. 4 is an explanatory diagram of a result of reliability test performed on the light detection device shown in FIG. 1.

Incidentally, when the light detection device shown in FIG. 1 is mounted on vehicles, satellites, or the like, use environment temperature may be relatively high, and therefore, high temperature exposure test is performed for 1000 hours at 125° C., for example, as a reliability test for a light detection device. In such a reliability test, when a light detection device is exposed to a high temperature for a long time, the diffusion of indium included in the In-bumps 80 into the Au layers 53 of the p-electrodes 50 and the wiring electrode 60 is increased. Therefore, the indium amount of the In-bumps 80 contributing to the connection of the signal processing board 90 and the photo detector 900 is gradually reduced. As a result, as shown in FIG. 4, the In-bumps 80 may be separated from electrodes (not shown) of the signal processing board 90. In such a case, a connection failure occurs between the photo detector 900 and the signal processing board 90, and the function as a light detection device is lost.

That is, a conventional light detection device for near-infrared light is generally used in a cooled state, and has not been assumed to be mounted on a vehicle or the like. The melting point of indium included in the In-bumps is relatively low, 156.6° C. For this reason, when indium is kept at temperatures of 100° C. or more for a long time, indium diffuses into the Au layers 53, and the indium amount of the In-bumps 80 decreases. This results in a connection failure between a photo detector and a signal processing board, and the light detection device function is lost.

(Light Detection Device)

Figure 5:
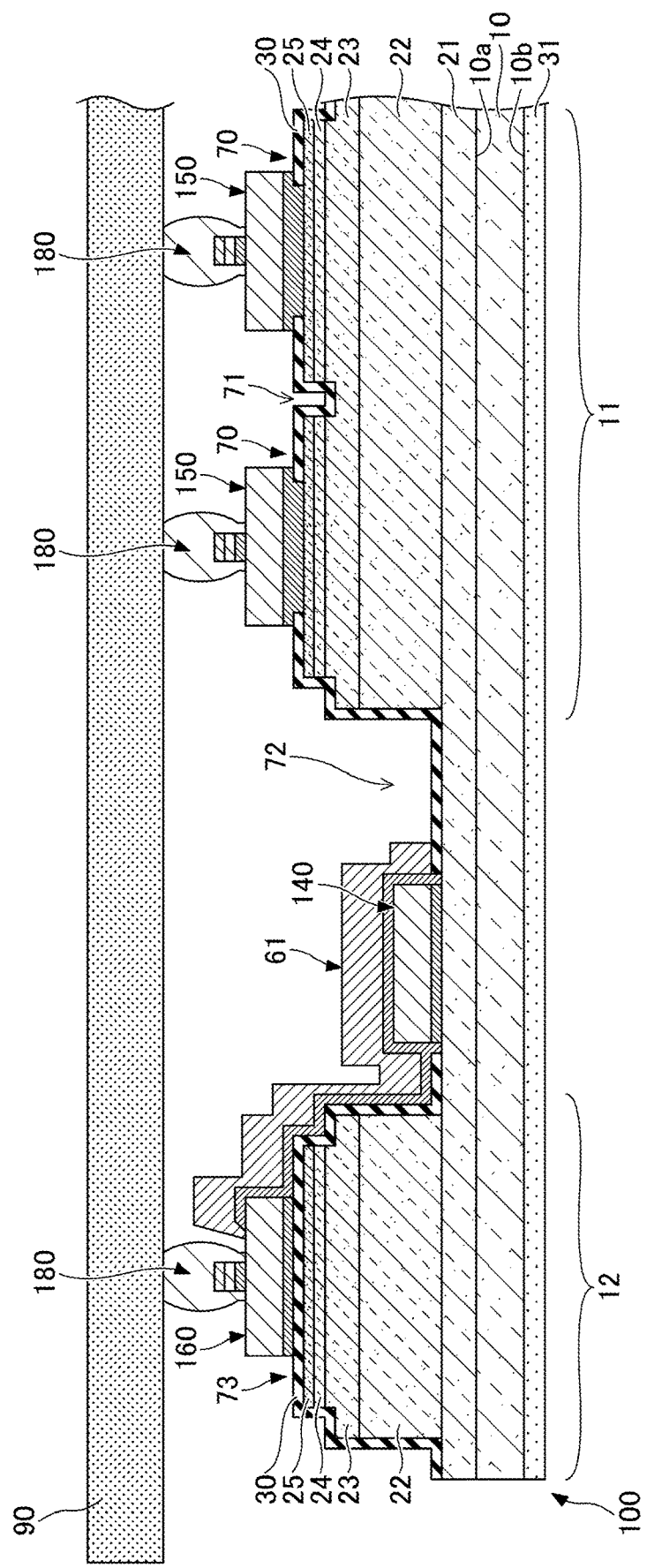
FIG. 5 is a cross-sectional view of a light detection device according to an embodiment of the present disclosure.
Figure 6:
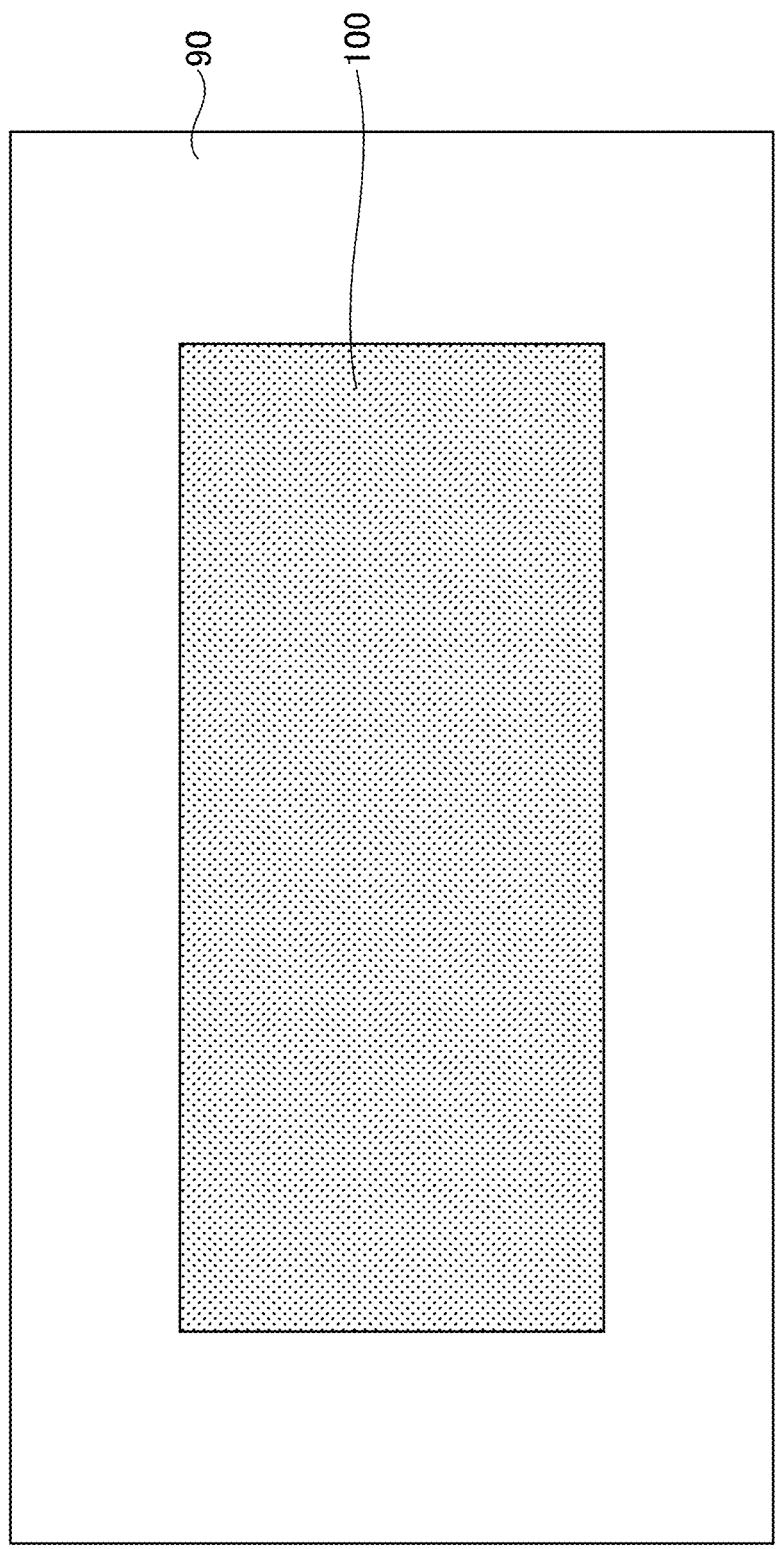
FIG. 6 is a plan view of a near-infrared light entering side of the light detection device according to the embodiment of the present disclosure.

Next, a light detection device according to the present embodiment will be described. In a light detection device according to the present embodiment, a photo detector 100 and a signal processing board 90 are connected to each other by conductive connection parts 180 including indium. In the present application, the signal processing board 90 may be described as a circuit board. FIG. 5 shows a cross-sectional structure of the main portion of the light detection device according to the present embodiment. FIG. 6 is a plan view as viewed from the photo detector 100 where light enters. The photo detector 100 has a length of 4.3 mm and a width of 13.9 mm, and 32×128 pixels are formed with a 90-μm pitch. Other examples include 256×320 pixels with a 30 μm pitch and 512×640 pixels with a 15-μm pitch.

The photo detector 100 of the light detection device according to the present embodiment includes an n-type contact layer 21, a light receiving layer 22, an n-type wide gap layer 23, a p-type wide gap layer 24, and a p-type contact layer 25 that are stacked in this order on one surface 10a of a substrate 10. On the other surface 10b of the substrate 10, an antireflection film 31 is formed of SiN or the like. In the present application, the re-type contact layer 21 may be described as a first contact layer, and the p-type contact layer 25 may be described as a second contact layer. The n-type wide gap layer 23 may be referred to as a first wide gap layer, and the p-type wide gap layer 24 may be referred to as a second wide gap layer.

In the photo detector 100, a first groove 71 for pixel isolation and a second groove 72 for exposing the n-type contact layer 21 are formed. The first groove 71 is formed by removing the p-type contact layer 25, the p-type wide gap layer 24, and a part of the n-type wide gap layer 23. The n-type wide gap layer 23 is exposed in the bottom surface of the first groove 71. By forming the first groove 71 in this way, a mesa 70 is formed for each pixel to isolate each pixel. Here, p-electrodes 150 are formed on the p-type contact layer 25.

The second groove 72 is formed by further removing the n-type wide gap layer 23 and the light receiving layer 22. In the bottom surface of the second groove 72, the re-type contact layer 21 is exposed. An n-electrode 140 is formed on the exposed n-type contact layer 21. In the present application, the p-electrodes 150 may be described as first electrodes, and the n-electrode 140 may be described as a second electrode.

The photo detector 100 is divided into a pixel region 11 and an electrode connection region 12 by a second groove 72. A mesa 73 is formed in the electrode connection region 12. A passivation film 30 is formed on the p-type contact layer 25 which is the top surface of the mesa 73. A wiring electrode 160 is formed on the passivation film 30. The wiring electrode 160 on the passivation film 30 in the electrode connection region 12 and the n-electrode 140 on the n-type contact layer 21 are connected by a wiring 61. The wiring 61 is formed on a part of the wiring electrode 160, the n-electrode 140, and the passivation film 30 covering the side of the mesa 73 between the wiring electrode 160 and the n-electrode 140 in the electrode connection region 12.

Figure 7:
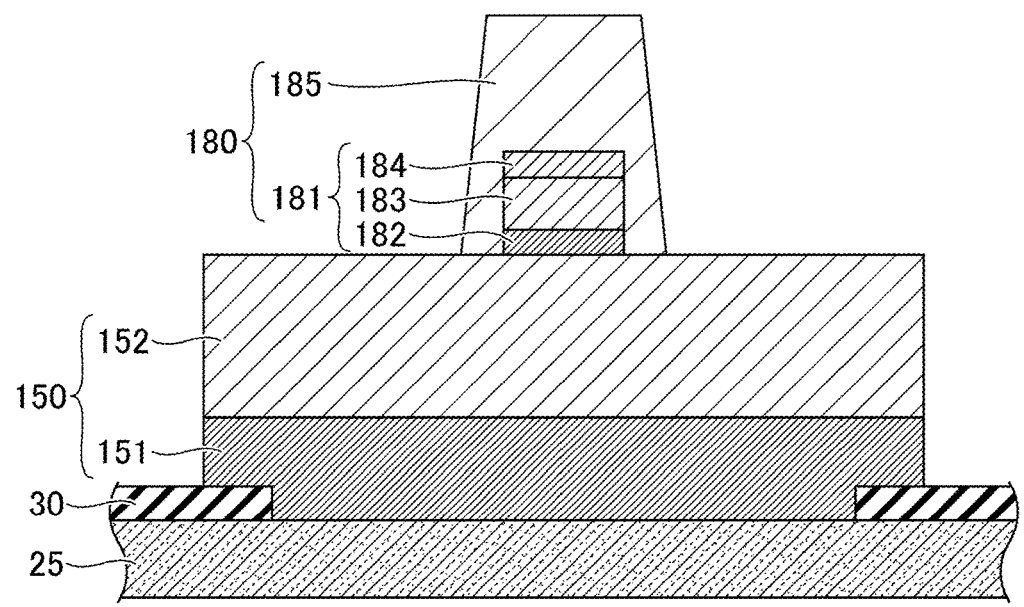
FIG. 7 is an explanatory view (1) of an electrode used in the light detection device according to the embodiment of the present disclosure.
Figure 8:
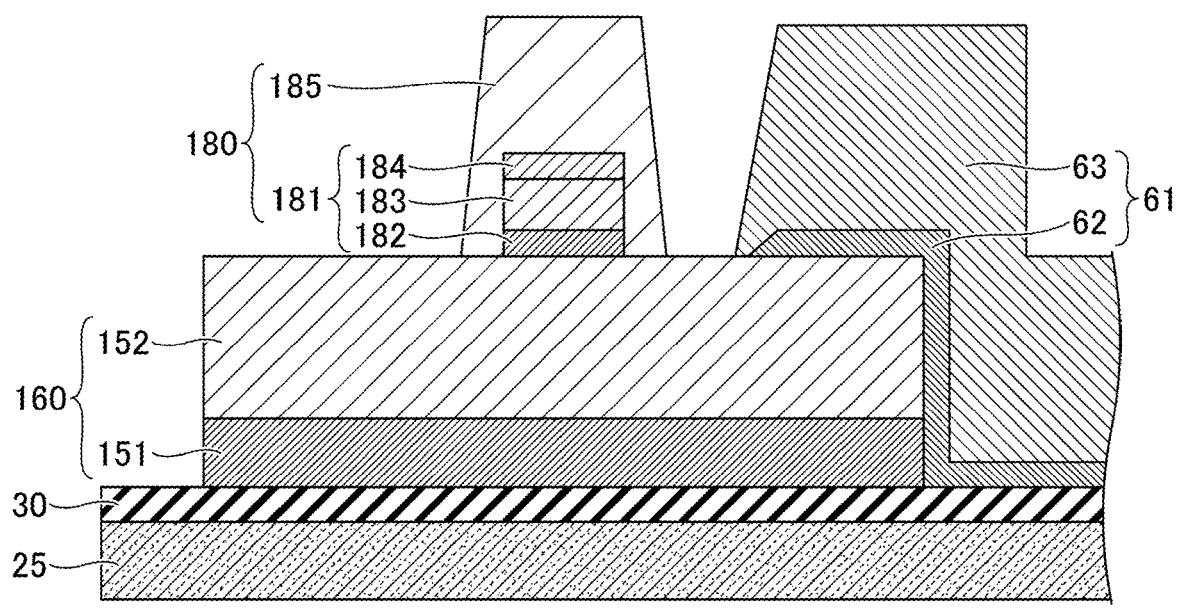
FIG. 8 is an explanatory view (2) of an electrode used in the light detection device according to the embodiment of the present disclosure.

FIG. 7 is an enlarged view of a p-electrode 150 and a conductive connection part 180 in the pixel region 11 of the photo detector 100 prior to being connected to the signal processing board 90. FIG. 8 is an enlarged view of the wiring electrode 160 and the conductive connection part 180 in the electrode connection region 12 of the photo detector 100 prior to being connected to signal processing board 90.

In the light detection device according to the present embodiment, each of the p-electrodes 150 and the wiring electrode 160 is formed of a metal laminated film in which a Ti layer 151 and a Pt (platinum) layer 152 are stacked in this order. Although not shown here, the n-electrode 140 is also formed of a metal laminated film in which a Ti layer 151 and a Pt layer 152 are stacked in this order. The thickness of the Ti layer 151 is preferably 50 nm or more and 100 nm or less. The thickness of the Pt layer 152 is preferably 50 nm or more and 100 nm or less. The Ti layer 151 and the Pt layer 152 require a certain thickness in order to obtain a uniform film, but when they are too thick, the stress of the film is increased, which is not preferable. In the present embodiment, for example, the thickness of the Ti layer 151 is 50 nm, and the thickness of the Pt layer 152 is 80 nm.

The conductive connection parts 180 are formed on the Pt layers 152 of the p-electrodes 150 and the wiring electrode 160. Each of the conductive connection parts 180 includes a connection core layer 181 and an indium layer (In-layer) 185 that are provided on the Pt layer 152. The connection core layer 181 is formed of a metal laminated film in which a Ti layer 182, a Ni layer 183, and an Au layer 184 are stacked in this order on the Pt layers 152 of the p-electrode 150 and the wiring electrode 160. The In-layer 185 is formed so as to cover the top surface and the side surface of the connection core layer 181.

Since Ti and Pt are highly adherent to each other, the Ti layer 182 of the connection core layer 181 is formed each on the Pt layers 152 of the p-electrodes 150 and the wiring electrode 160, and the Ti layer 182 and the Pt layer 152 are in contact with each other.

In the light detection device according to the present embodiment, the signal processing board 90 and the photo detector 100 are connected by the conductive connection parts 180. When the signal processing board 90 and the photo detector 100 are connected by the conductive connection parts 180, a part of indium contained in the In-layers 185 of the conductive connection parts 180 enters and further diffuses into the Au layers 184 of the connection core layers 181, resulting in being partially alloyed with Au. Thus, since a part of indium contained in the In-layers 185 diffuses into the Au layers 184 and is alloyed with Au, the adhesion between the In-layers 185 and the Au layers 184 can be improved.

In addition, since the conductive connection parts 180 are formed on the Pt layers 152 of the p-electrodes 150 and the wiring electrode 160, a part of indium contained in the In-layers 185 of the conductive connection parts 180 does not enter and diffuse into the Pt layers 152. Therefore, even when the light detection device is exposed to a high temperature for a long time, indium contained in the In-layers 185 of the conductive connection parts 180 enters only the Au layers 184 with a smaller area, and thus the reduction of the In-layers 185 of the conductive connection parts 180 is extremely small. Therefore, even when the high-temperature condition continues for a long time, the electrodes (not shown) of the signal processing board 90 are kept electrically connected to the p-electrodes 150 and the wiring electrode 160 through the conductive connection parts 180, so that the reliability can be improved when they are mounted on vehicles or the like.

Figure 9:
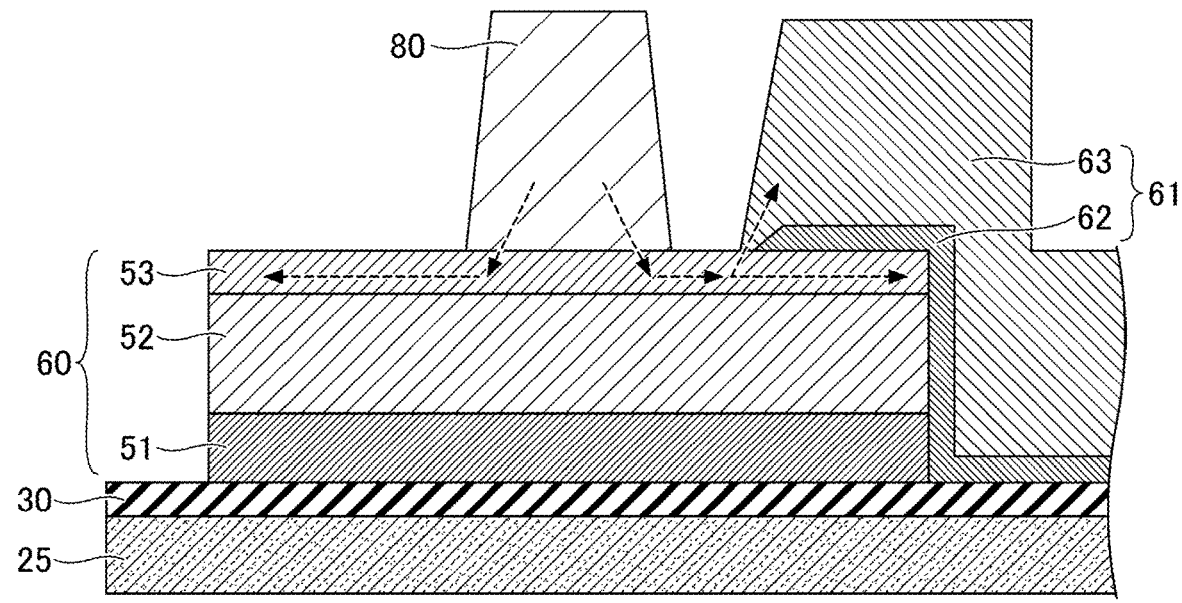
FIG. 9 is an explanatory diagram for explaining indium diffusion in the light detection device shown in FIG. 1.

For example, in the light detection device shown in FIG. 1, when the light detection device is left at a high temperature for a long time, indium of an In-bump 80 in the electrode connection region 12 enters and diffuses into the Au layer 53 of the wiring electrode 60, as shown by the broken line arrows in FIG. 9. This indium diffusion may further proceed to the Au layer 63 of the wiring 61.

Figure 10:
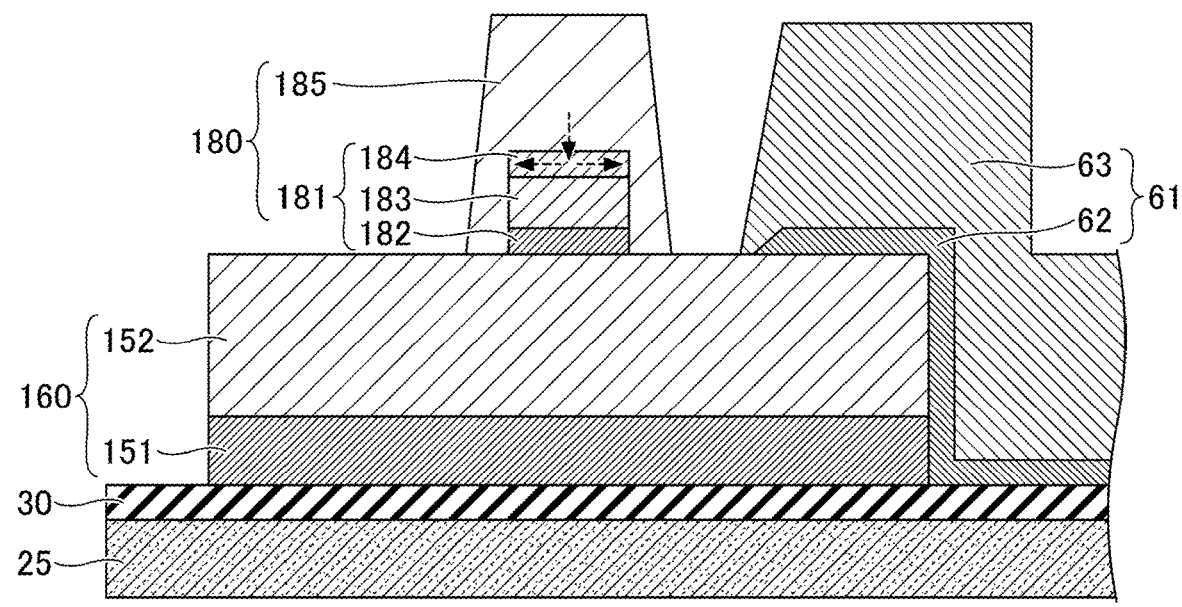
FIG. 10 is an explanatory diagram for explaining indium diffusion in the light detection device according to an embodiment of the present disclosure.

In contrast, in the light detection device according to the present embodiment, when placed in a high temperature environment for a long time, as shown by the broken line arrows in FIG. 10, indium of the In-layer 185 in the conductive connection part 180 enters and diffuses into the Au layer 184. Since the area of the Au layer 184 viewed from the top is sufficiently smaller than the area of the wiring electrode 160, the amount of indium entering the Au layer 184 is limited. In addition, since the conductive connection part 180 is formed on the Pt layer 152 of the wiring electrode 160, indium of the In-layer 185 in the conductive connection part 180 does not enter the Pt layer 152 of the wiring electrode 160.

Figure 11:
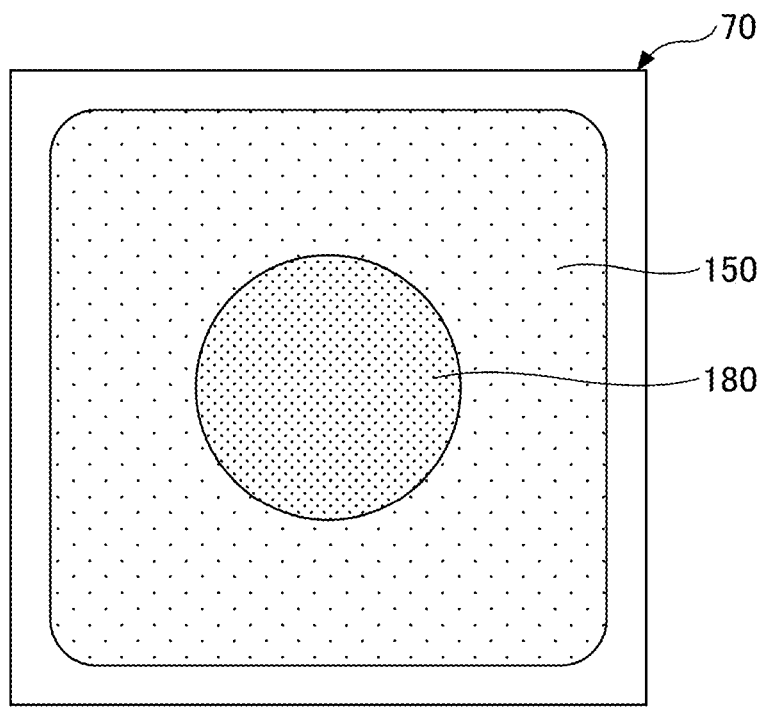
FIG. 11 is a top view of a p-electrode having a conductive connection part formed thereon in the light detection device according to the embodiment of the present disclosure.

FIG. 11 is a top plan view of a single pixel in the pixel region 11 shown in FIG. 7. As shown in FIG. 11, in each pixel of the pixel region 11, the p-electrode 150 having a substantially square shape with a side length of about 73 µm is formed on the top surface of the mesa 70 having a substantially square shape with a side length of about 85 µm, and the conductive connection part 180 is formed in the central region on the top surface of the p-electrode 150. The diameter of the conductive connection part 180 is about 30 µm.

(Method for Producing Light Detection Device)

Next, a method for producing a light detection device according to the present embodiment will be described with reference to FIGS. 12 to 20.

Figure 12:
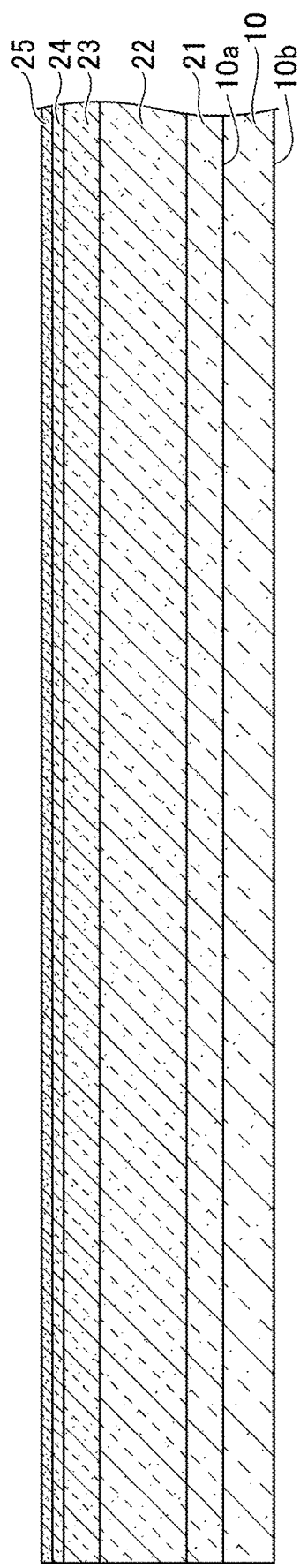
FIG. 12 is a process diagram (1) of a method for producing a light detection device according to an embodiment of the present disclosure.

First, as shown in FIG. 12, an n-type contact layer 21, a light receiving layer 22, an n-type wide gap layer 23, a p-type wide gap layer 24, and a p-type contact layer 25 are stacked in this order on one surface 10a of a substrate 10 by epitaxial growth. For the epitaxial growth of the compound semiconductors, a metal organic vapor phase epitaxial growth method is used.

The substrate 10 is a semi-insulating substrate having a thickness of about 350 µm, and is doped with Fe as an impurity element. The n-type contact layer 21 is formed of a n-InP layer having a thickness of about 2 µm, and is doped with Si having a concentration of about $2\times10^{18}$ cm$^{-3}$ as an n-type impurity element. The light receiving layer 22 is formed of an undoped In$_{0.53}$Ga$_{0.47}$As layer having a thickness of about 3.5 µm, and has a bandgap of 0.75 eV at room temperature.

The n-type wide gap layer 23 is formed of a n-InP layer having a thickness of about 0.5 µm, and is doped with Si having a concentration of about $2\times10^{15}$ cm$^{-3}$ as an n-type impurity element. The p-type wide gap layer 24 is formed of a p-InP layer having a thickness of about 0.2 µm, and is doped with Zn having a concentration of about $5\times10^{18}$ cm$^{-3}$ as a p-type impurity element. The p-type contact layer 25 is formed of a p-InGaAs layer having a thickness of about 0.1 µm, and is doped with Zn having a concentration of about $1\times10^{19}$ cm$^{-3}$ as a p-type impurity element.

Figure 13:
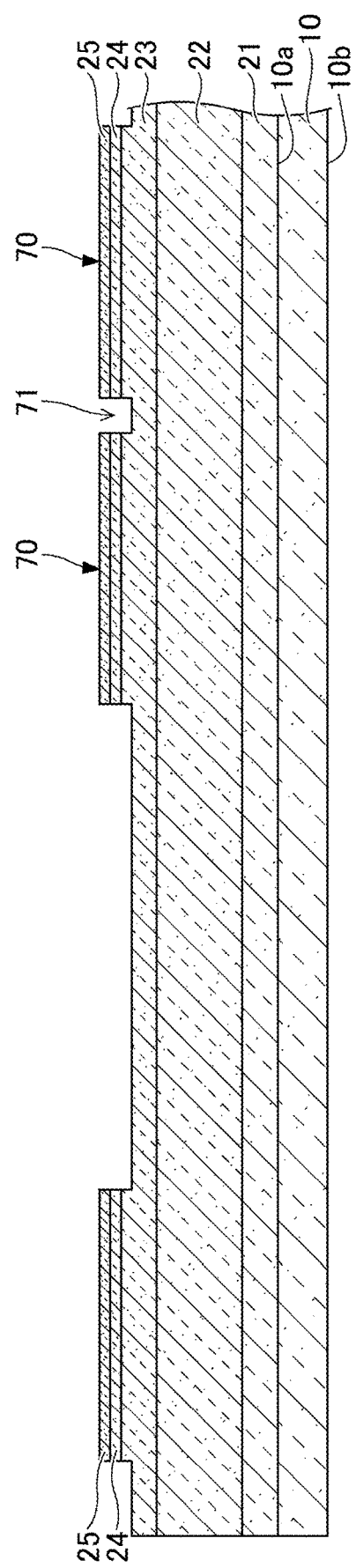
FIG. 13 is a process diagram (2) of the method for producing a light detection device according to an embodiment of the present disclosure.

Next, a first groove 71 for pixel isolation is formed, as shown in FIG. 13. Specifically a 100-nm-thick SiN film (not shown) is formed on the p-type contact layer 25 by a plasma CND. Thereafter, a photoresist is applied on the formed SiN film, and exposure with an exposure equipment and development are performed to form a resist pattern (not shown). The resist pattern has an opening in a region where the first groove 71 is to be formed. The SiN film in the opening of the resist pattern is removed by wet etching using a buffered hydrofluoric acid to form a mask using the SiN film. Thereafter, the resist pattern (not shown) is removed by an organic solvent or the like. Thereafter, the p-type contact layer 25, the p-type wide gap layer 24 and a part of the n-type wide gap layer 23 in a region where the SiN film is removed are removed by dry etching such as a reactive ion etching (RIE). Thus, the first groove 71 for pixel isolation is formed. In this step, a semiconductor layer in a region where a second groove 72 to be described later is formed is similarly removed. After this, the SiN film (not shown) is removed by a buffered hydrofluoric acid.

The first groove 71 has a depth of about 0.6 µm and a width W of about 5 µm. The n-type wide gap layer 23 is exposed in the bottom surface of the first groove 71. Thus, by forming the first groove 71, each pixel is formed by a mesa 70 divided by the first groove 71. For example, 128 pixels are formed at a 90-µm pitch in the longitudinal direction, 32 pixels are formed at a 90-µm pitch in the horizontal direction, and a total of 4096 pixels are formed.

Figure 14:
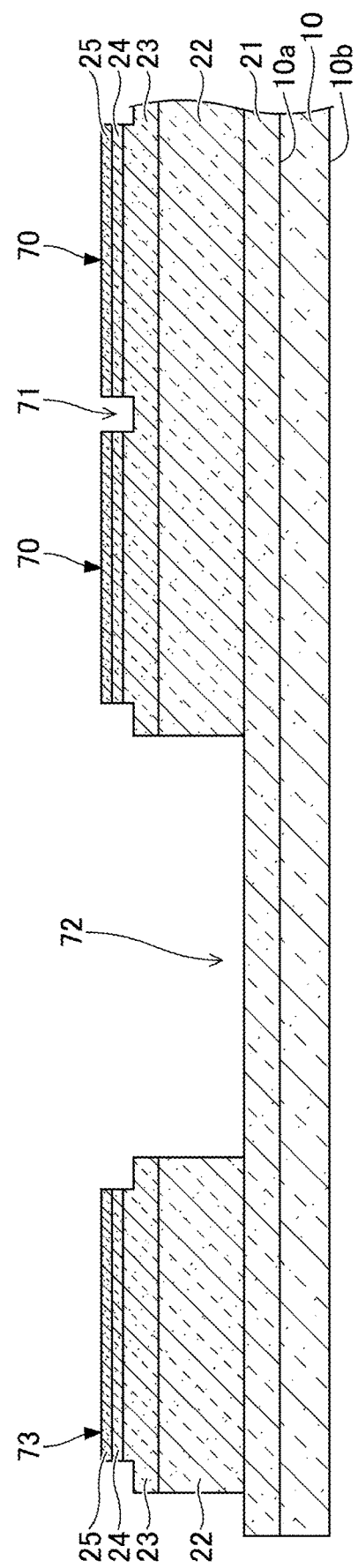
FIG. 14 is a process diagram (3) of the method for producing a light detection device according to the embodiment of the present disclosure.

Next, as shown in FIG. 14, a second groove 72 is formed along the outer periphery of the substrate 10. Specifically, a 100-nm-thick SiN film (not shown) is formed on the p-type contact layer 25 and the like by a plasma CVD. On the top surface of the deposited SiN film, a photoresist is applied, and exposure with an exposure equipment and development are performed to form a resist pattern (not shown). This resist pattern has an opening in a region where the second groove 72 is to be formed. The SiN film in the opening of the resist pattern is removed by wet etching using a buffered hydrofluoric acid to form a mask using the SiN film. Thereafter, the resist pattern (not shown) is removed by an organic solvent or the like. Further, the n-type wide gap layer 23 and the light receiving layer 22 in a region where the SiN film is removed are removed by dry etching such as a RIE to expose the surface of the n-type contact layer 21. After this, the SiN film (not shown) is removed by a buffered hydrofluoric acid. As a result, a mesa 73 is formed outside the second groove 72.

Figure 15:
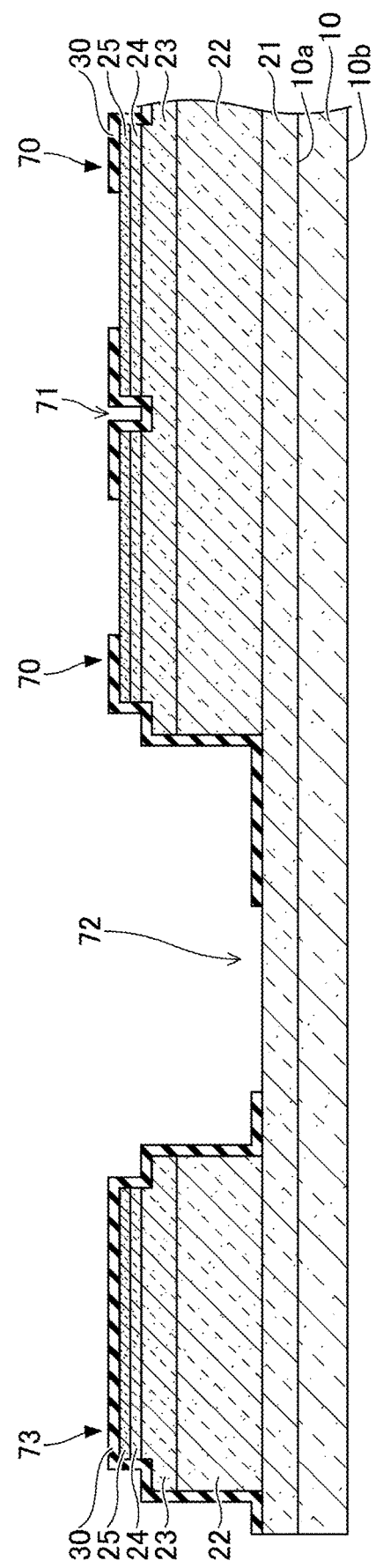
FIG. 15 is a process diagram (4) of the method for producing a light detection device according to the embodiment of the present disclosure.

Next, a passivation film 30 is formed as shown in FIG. 15. Specifically, a 100-nm-thick SiN film (not shown) is formed on the entire surface by a plasma CVD. On the deposited SiN film, a photoresist is applied, and exposure with an exposure equipment and development are performed to form a resist pattern (not shown). The resist pattern has openings in regions where an n-electrode 140 and p-electrodes 150 are to be formed. The SiN film in the openings of the resist pattern is removed by dry etching such as a RIE. Thus, the surface of the p-type contact layer 25 which is the top surface of the mesa 70, and the surface of the n-type contact layer 21 are exposed.

Figure 16:
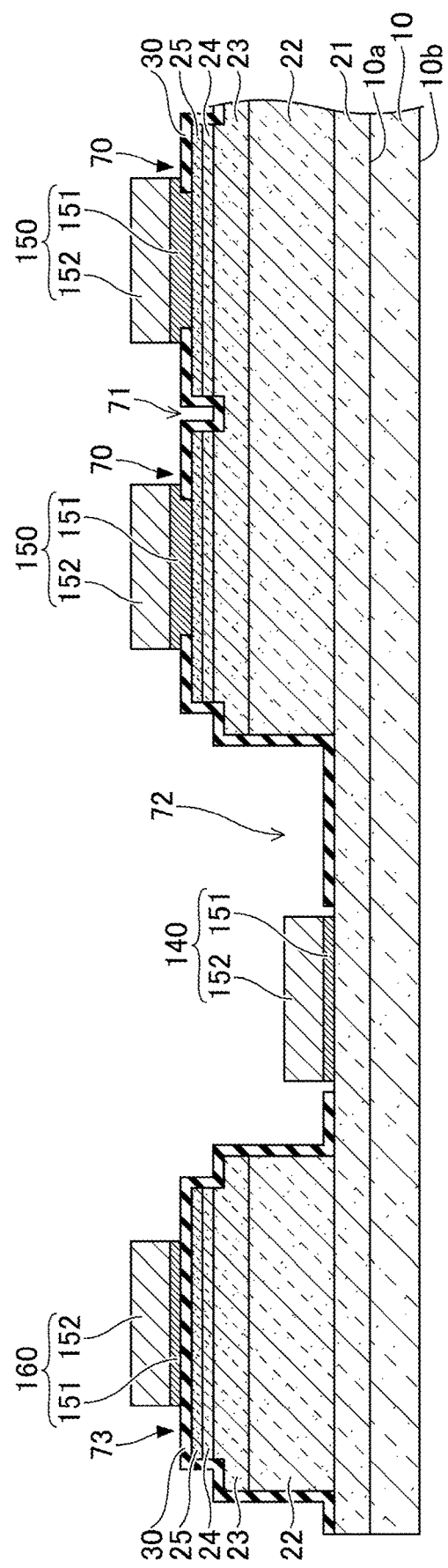
FIG. 16 is a process diagram (5) of the method for producing a light detection device according to the embodiment of the present disclosure.

Next, as shown in FIG. 16, the n-electrode 140 is formed on the n-type contact layer 21, and the p-electrodes 150 are formed on the p-type contact layer 25. A wiring electrode 160 is formed on the mesa 73 in the outer periphery through the passivation film 30. The n-electrode 140, the p-electrodes 150, and the wiring electrode 160 are formed by a lift-off method. More specifically, a resist pattern (not shown) is formed so as to have an opening on a region where each electrode is to be formed. Thereafter, a Ti layer 151 and a Pt layer 152 are stacked in this order by an EB deposition to form a metal laminated film, and then the metal laminated film is immersed in an organic solvent or the like. Thereby, the metal laminated film formed on the resist pattern is removed together with the resist pattern, and the n-electrode 140, the p-electrodes 150, and the wiring electrode 160 are formed by the remaining metal laminated film.

Figure 17:
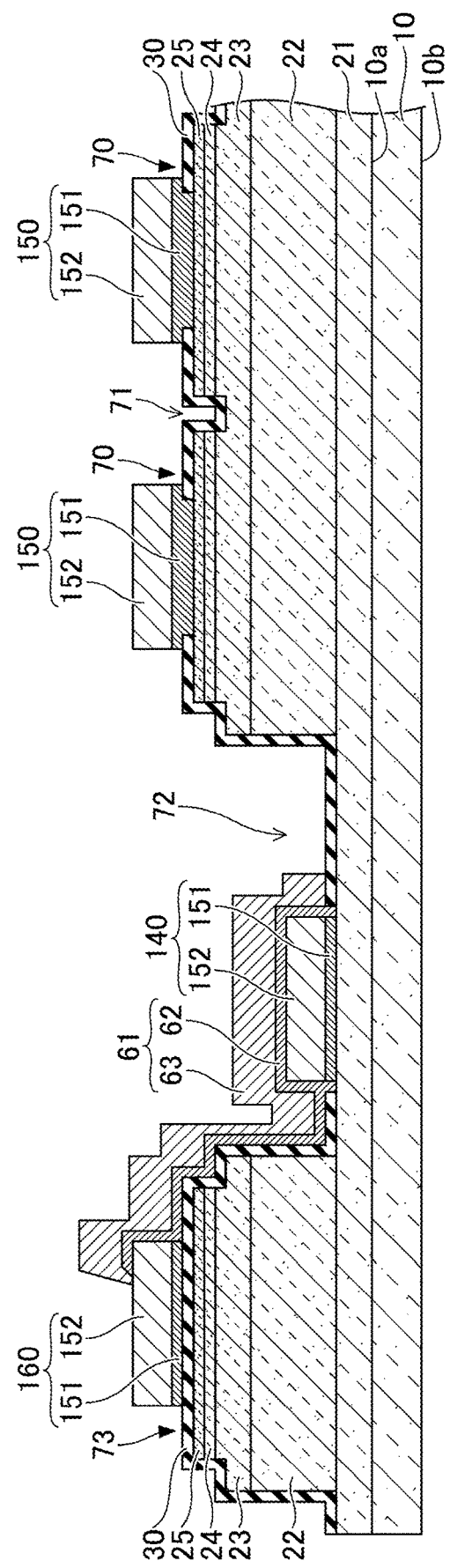
FIG. 17 is a process diagram (6) of the method for producing a light detection device according to the embodiment of the present disclosure.

Next, as shown in FIG. 17, a wiring 61 is formed by a lift-off method to connect the n-electrode 140 and the wiring electrode 160. The wiring 61 is formed of a laminated film including a Ti layer 62 having a thickness of about 50 nm and an Au layer 63 having a thickness of about 600 nm. Thereafter, the other surface 10b of the substrate 10 is polished to form a mirror surface.

Figure 18:
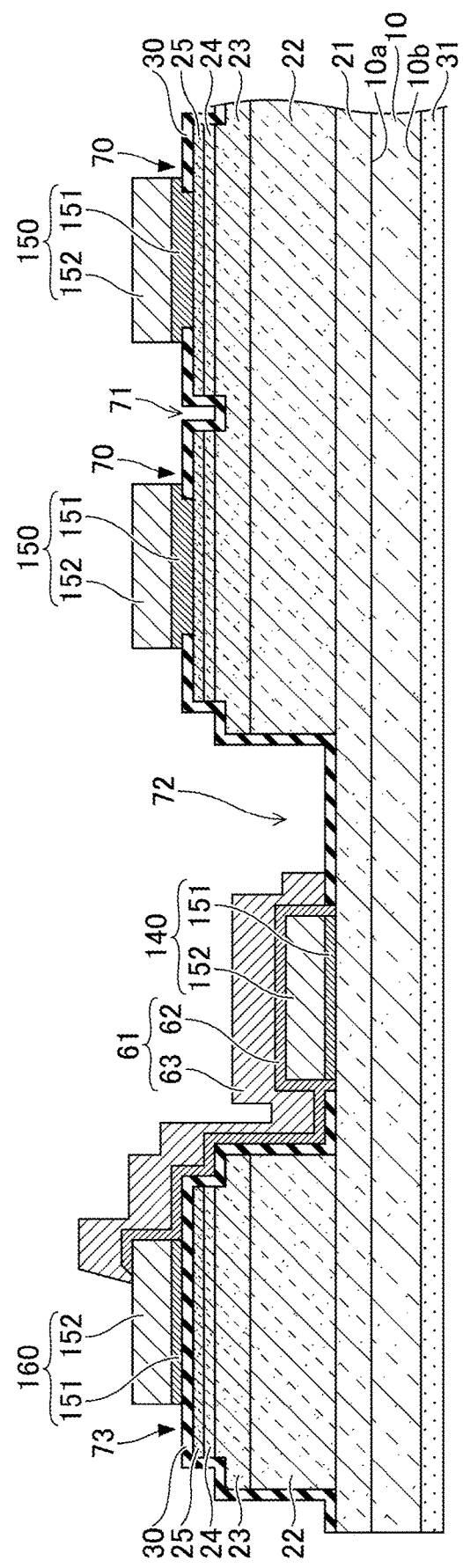
FIG. 18 is a process diagram (7) of the method for producing a light detection device according to the embodiment of the present disclosure.

Next, as shown in FIG. 18, an antireflection film 31 is formed on the other surface 10b of the substrate 10 using a SiN film. The antireflection film 31 is formed by depositing a SiN film by a plasma CVD. The antireflection film 31 has a refractive index of about 1.71 to 1.83, and a thickness of 140 nm to 160 nm.

Figure 19:
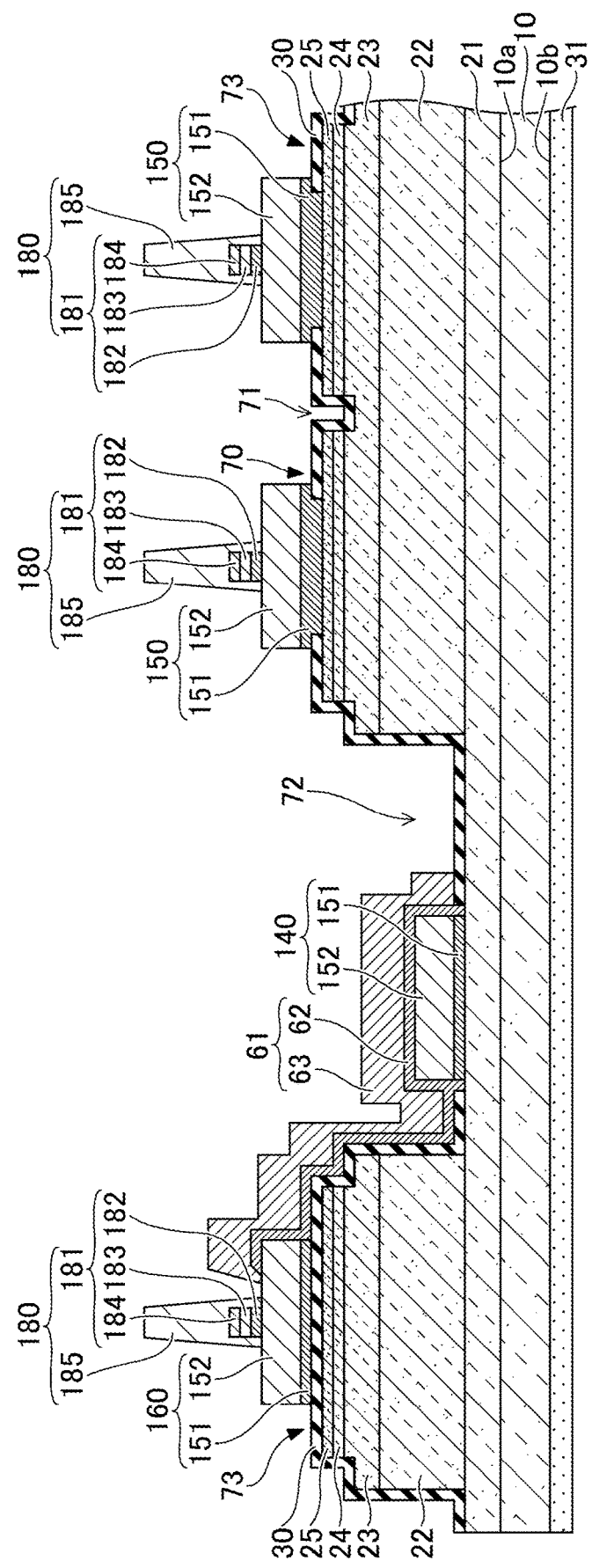
FIG. 19 is a process diagram (8) of the method for producing a light detection device according to the embodiment of the present disclosure.

Next, as shown in FIG. 19, conductive connection parts 180 are formed on the p-electrodes 150 and the wiring electrode 160 by a lift-off method. Specifically, a resist pattern (not shown) is formed so as to have openings on regions where the conductive connection parts 180 are to be formed. Thereafter, by an EB deposition, a Ti layer 182, a Ni layer 183, an Au layer 184, and an In-layer 185 are stacked in this order to form a metal laminated film. Thereafter, by immersing the metal laminated film in an organic solvent or the like, the metal laminated film formed on the resist pattern is removed together with the resist pattern. As a result, the Ti layer 182, the Ni layer 183, the Au layer 184, and the In-layer 185 are formed by the remaining metal laminated film, and each conductive connection part 180 is formed. The resist pattern used for forming the conductive connection parts 180 by a lift-off method is an inversely tapered resist pattern in which the interior part is wider than the opening. Therefore, the In-layer 185 is formed so as to cover a connection core layer 181 formed of the Ti layer 182, the Ni layer 183, and Au layer 184. Each of the conductive connection parts 180 formed in this way has a height of about 6 µm to 9 µm.

Figure 20:
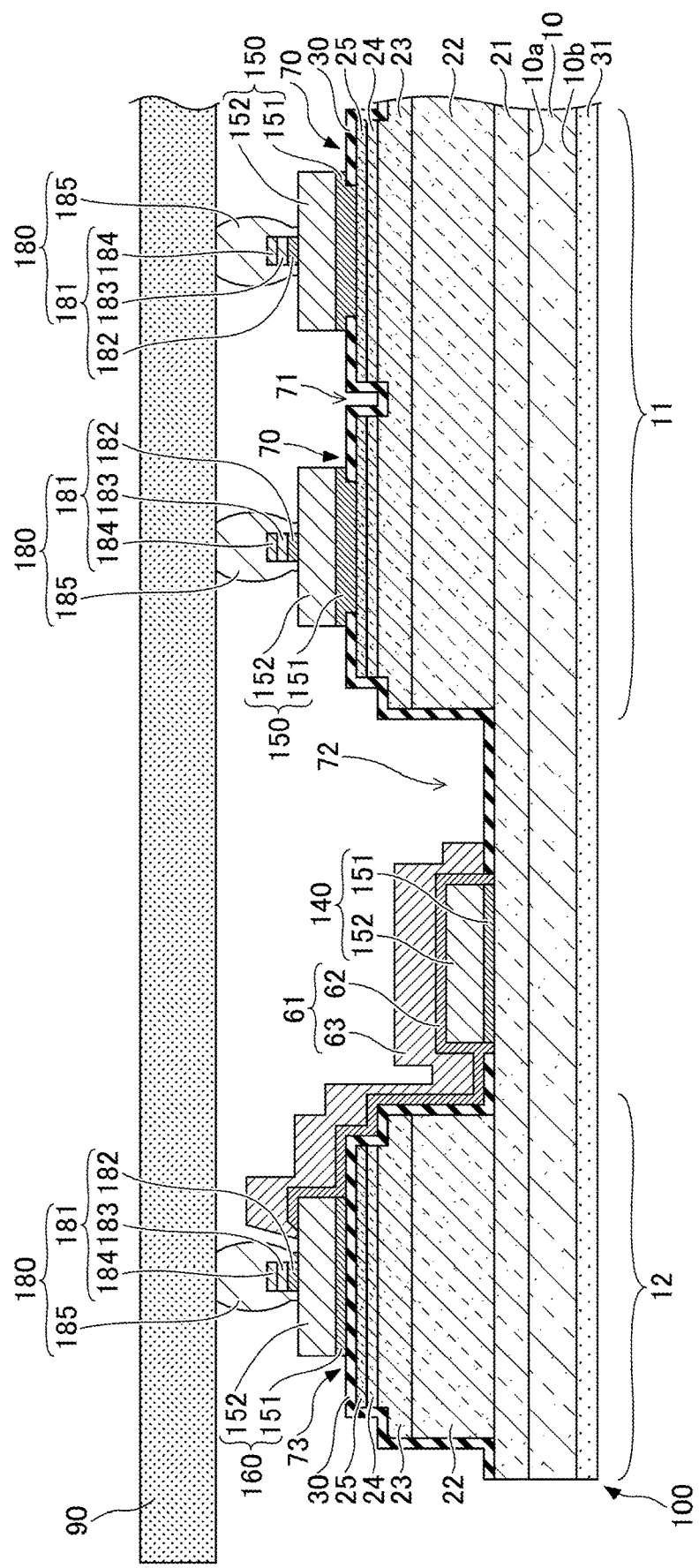
FIG. 20 is a process diagram (9) of the method for producing a light detection device according to the embodiment of the present disclosure.

Thereafter, a photo detector 100 is formed by dividing into chips. Thereafter; as shown in FIG. 20, the conductive connection parts 180 of the photo detector 100 and the electrodes (not shown) of the signal processing board 90 are bonded by a temporary pressure bonding, followed by reflow at temperatures of 170° C. to 180° C. As a result, indium of the In-layers 185 is melted, so that the conductive connection parts 180 of the photo detector 100 and the electrodes (not shown) of the signal processing board 90 are bonded and electrically connected to each other. During the reflow, since the molten indium of the In-layers 185 is present in the periphery of the connection core layers 181 due to surface tension or the like, self-alignment can be made when bonding the conductive connection parts 180 of the photo detector 100 with the electrodes (not shown) of the signal processing board 90.

In the light detection device according to the present embodiment, near-infrared light entered from the other surface 10b of the substrate 10 to which the signal processing board 90 is not bonded is detected through the antireflection film 31.

The embodiments of the present disclosure have been described above. However, the embodiments of the present disclosure disclosed above are only illustrative, and the scope of the present invention is not limited to the specific embodiments of the disclosure. It is to be understood that the scope of the present invention is defined in the appended claims and includes equivalence of the description of the claims and all changes within the scope of the claims.

What is claimed is:
1. A light detection device comprising:
a photo detector; and
a circuit board connected to the photo detector by conductive connection parts,
the photo detector including a substrate, a semiconductor layer provided on one surface of the substrate, a first groove dividing the semiconductor layer into sections for respective pixels, and first electrodes provided on the semiconductor layer and serving as the pixels,
each of the conductive connection parts containing indium, each of the first electrodes including a Ti layer and a Pt layer stacked in this order on the semiconductor layer, and the conductive connection parts being provided on the Pt layers of the first electrodes, wherein each of the conductive connection parts includes a connection core layer having a Ti layer and an Au layer stacked in this order on the Pt layer of the first electrode, and an indium layer covering the connection core layer.

2. The light detection device according to claim 1, wherein the thickness of the Ti layer in each of the first electrodes is 50 nm or more and 100 nm or less, and the thickness of the Pt layer in each of the first electrodes is 50 nm or more and 100 nm or less.

3. The light detection device according to claim 1, wherein
the semiconductor layer includes a first contact layer, a light receiving layer, a first wide gap layer, a second wide gap layer, and a second contact layer that are stacked in this order on the one surface of the substrate, and the first groove is a groove where the second contact layer, the second wide gap layer, and a part of the first wide gap layer are removed.

4. The light detection device according to claim 3, further comprising: around the pixels,
a second groove formed by removing the second contact layer, the second wide gap layer, the first wide gap layer and the light receiving layer;

a second electrode provided on the first contact layer exposed in the bottom surface of the second groove;

a wiring electrode provided on a mesa of the semiconductor layer around the second groove; and a wiring connecting the second electrode and the wiring electrode, the wiring electrode including a Ti layer and a Pt layer stacked in this order, and another conductive connection part being also provided on the Pt layer of the wiring electrode, said another conductive connection part containing indium.

5. The light detection device according to claim 4, wherein the wiring includes a Ti layer and an Au layer stacked in this order.

6. The light detection device according to claim 3, wherein the light receiving layer includes InGaAs.

7. The light detection device according to claim 1, wherein the connection core layer has the Ti layer, a Ni layer and the Au layer stacked in this order.

8. A light detection device comprising:
a photo detector; and
a circuit board connected to the photo detector by conductive connection parts, the photo detector including a substrate, a semiconductor layer provided on one surface of the substrate, a first groove dividing the semiconductor layer into sections for respective pixels, and first electrodes provided on the semiconductor layer and serving as the pixels, each of the conductive connection parts containing indium, each of the first electrodes including a Ti layer and a Pt layer stacked in this order on the semiconductor layer, and the conductive connection parts being provided on the Pt layers of the first electrodes, wherein
the semiconductor layer includes a first contact layer, a light receiving layer, a first wide gap layer, a second wide gap layer, and a second contact layer that are stacked in this order on the one surface of the substrate, and the first groove is a groove where the second contact layer, the second wide gap layer, and a part of the first wide gap layer are removed.

9. The light detection device according to claim 8, further comprising: around the pixels,
a second groove formed by removing the second contact layer, the second wide gap layer, the first wide gap layer and the light receiving layer;

a second electrode provided on the first contact layer exposed in the bottom surface of the second groove;

a wiring electrode provided on a mesa of the semiconductor layer around the second groove; and a wiring connecting the second electrode and the wiring electrode, the wiring electrode including a Ti layer and a Pt layer stacked in this order, and another conductive connection part being also provided on the Pt layer of the wiring electrode, said another conductive connection part containing indium.

10. The light detection device according to claim 9, wherein the wiring includes a Ti layer and an Au layer stacked in this order.

11. The light detection device according to claim 8, wherein the light receiving layer includes InGaAs.

12. The light detection device according to claim 8, wherein each of the conductive connection parts has a Ti layer, a Ni layer and an Au layer stacked in this order.

* * * * *